(12) United States Patent
He et al.

(10) Patent No.: US 10,269,596 B2
(45) Date of Patent: Apr. 23, 2019

(54) TRANSFER DEVICE WITH THREE MACHINE BASES AND TRANSFER METHOD THEREOF

(71) Applicant: BOE TECHNOLOGY GROUP CO., LTD., Beijing (CN)

(72) Inventors: Xiaolong He, Beijing (CN); Zhifu Li, Beijing (CN); Zhiyuan Ji, Beijing (CN); Jikai Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 5 days.

(21) Appl. No.: 15/673,688

(22) Filed: Aug. 10, 2017

(65) Prior Publication Data

US 2018/0061687 A1    Mar. 1, 2018

(30) Foreign Application Priority Data

Aug. 24, 2016    (CN) .......................... 2016 1 0720984

(51) Int. Cl.

| H01L 21/68 | (2006.01) |
| H01L 21/67 | (2006.01) |
| B25J 9/16  | (2006.01) |
| G06T 1/00  | (2006.01) |
| B08B 7/00  | (2006.01) |
| B65G 43/00 | (2006.01) |

(Continued)

(52) U.S. Cl.

CPC ...... *H01L 21/67144* (2013.01); *B08B 7/0028* (2013.01); *B25J 9/1697* (2013.01); *B65G 43/00* (2013.01); *G06T 1/0014* (2013.01); *H01L 21/67* (2013.01); *H01L 21/67259* (2013.01); *H01L 21/681* (2013.01); *H01L 24/75* (2013.01); *H01L 24/95* (2013.01); *H01L 25/0753* (2013.01); *H01L 2224/7598* (2013.01); *H01L 2224/75753* (2013.01); *H01L 2224/75801* (2013.01); *H01L 2224/75821* (2013.01); *H01L 2224/95121* (2013.01)

(58) Field of Classification Search

CPC ..... B25J 9/1697; G06T 1/0014; H01L 21/681
See application file for complete search history.

(56) References Cited

U.S. PATENT DOCUMENTS

| 7,020,953 B2 * | 4/2006 | Ueno ................ H01L 21/67144 29/739 |
| 8,819,929 B2 * | 9/2014 | Noda ................ H01L 21/67144 29/740 |

(Continued)

*Primary Examiner* — Gerald McClain
(74) *Attorney, Agent, or Firm* — Nath, Goldberg & Meyer; Joshua B. Goldberg; Daniel Bissing

(57) ABSTRACT

A transfer device with three transfer bases comprises: a first machine base that carries a substrate; and at least one transfer assembly that is located above the first machine base, wherein the at least one transfer assembly comprises: a second machine base that carries a target device; a third machine base that is located above the second machine base; and a transfer head that is disposed on the third machine base for acquiring the target device from the second machine base and transferring the target device to a prescribed location on the substrate. In this disclosure, since the transfer assembly is located above the first machine base, a path that the transfer head needs to move along to complete the transfer process is shorter, thereby improving the production efficiency.

14 Claims, 4 Drawing Sheets

(51) Int. Cl.
*H01L 23/00* (2006.01)
*H01L 25/075* (2006.01)

(56) References Cited

U.S. PATENT DOCUMENTS

| | | | |
|---|---|---|---|
| 9,721,819 B2* | 8/2017 | Speer | H01L 21/681 |
| 2016/0176045 A1* | 6/2016 | Golda | B25J 15/0085 |
| | | | 414/806 |
| 2016/0190088 A1* | 6/2016 | Yu | B32B 37/02 |
| | | | 438/107 |
| 2016/0276205 A1* | 9/2016 | Huska | H01L 33/62 |
| 2017/0062257 A1* | 3/2017 | Speer | H01L 21/56 |

* cited by examiner by the at least one transfer assembly, transferring the target device to the prescribed position on the substrate carried by the first machine base

TRANSFER DEVICE WITH THREE MACHINE BASES AND TRANSFER METHOD THEREOF

CROSS-REFERENCE TO RELATED APPLICATION

This application claims the priority of Chinese Patent Application No. 201610720984.X submitted to the Chinese Intellectual Property Office on Aug. 24, 2016, the disclosure of which is incorporated herein in its entirety by reference.

TECHNICAL FIELD

This disclosure relates to the technical field of micro transfer, and particularly relates to a transfer device and a transfer method thereof.

BACKGROUND OF THE INVENTION

With micro transfer technology, a target device can be transferred to a substrate made of materials such as plastics and glass with low cost, high accuracy and on a large scale. If the micro transfer technology gets widely applied, it will promote scale production and reduce cost of flexible display products, thereby realizing integration of integrated circuits, sensors and display screens, and further realizing, for example, micro LED display, which will bring about a revolution to the display industry and even the semiconductor industry.

In the current micro transfer technology, the substrate, the target device and the cleaning device are placed on the same plane, and then the transfer process is completed manually or mechanically through a transfer head.

However, in the prior art, the transfer head needs to move a long path before completing the transfer process, which decreases the production efficiency.

SUMMARY

The present disclosure has been accomplished in order to at least partially solve the problems in the prior art. The present disclosure provides a transfer device and a transfer method thereof that can improve the production efficiency.

According to one aspect of the disclosure, there is provided a transfer device comprising:
a first machine base that carries a substrate; and
at least one transfer assembly that is located above the first machine base,
wherein the at least one transfer assembly comprises:
a second machine base that carries a target device;
a third machine base that is located above the second machine base; and
a transfer head that is disposed on the third machine base for acquiring the target device from the second machine base and transferring the target device to a prescribed location on the substrate.

The at least one transfer assembly may further comprise:
an optical alignment means that is disposed on the third machine base; and
a first alignment mark that is disposed on the transfer head and located opposite to and below the optical alignment means.

The substrate may be provided with a second alignment mark that is aligned with the first alignment mark by the optical alignment means so that the target device is aligned with a prescribed position on the substrate.

The transfer device may further comprise:
a third driving mechanism that is connected with the third machine base to drive the third machine base to move toward the second machine base, thereby driving the transfer head to acquire the target device from the second machine base, and then to drive the third machine base to move toward the substrate, thereby driving the transfer head to transfer the target device to the prescribed position on the substrate.

The transfer device may further comprise:
a second driving mechanism that is connected to the second machine base to drive the second machine base to move away from below the transfer head after the transfer head has acquired the target device.

The second machine base may be provided with a cleaning device, and
after the transfer head transfers the target device to the prescribed position on the substrate, the second driving mechanism drives the second machine base to move to below the transfer head, and then the third driving mechanism drives the third machine base to move toward the second machine base so as to drive the transfer head to press toward the cleaning device to realize cleaning of the transfer head.

The transfer device may further comprise:
a device body; and
a mechanical arm that is disposed on the device body,
wherein the second driving mechanism and the third driving mechanism are both disposed on the mechanical arm.

The mechanical arm may comprise:
a support member that is disposed on the device body at one end;
a carrying member that is supported by the other end of the support member and provided with the third driving mechanism; and
a connecting member that is disposed on the carrying member at one end and provided with the second driving mechanism on the other end.

Alternatively, the mechanical arm may also comprise:
a support member that is disposed on the device body at one end;
a carrying member that is supported by the other end of the support member and provided with the third driving mechanism; and
a connecting member that is disposed on the support member at one end and provided with the second driving mechanism on the other end.

When the number of the at least one transfer assembly is two or more, the at least one transfer assembly is arranged in parallel, and transfers the target device to the prescribed position on the substrate synchronously.

Alternatively, when the number of the at least one transfer assembly is two or more, each of the transfer assemblies transfers the target device to the prescribed position on the substrate independently.

The transfer device may further comprise:
a device body; and
a plurality of mechanical arms disposed on the device body, each of which is provided with a transfer assembly.

The transfer device may further comprise:
a first driving mechanism that is disposed on the device body, on which the first machine base is disposed so that the first driving mechanism can drive the first machine base to move.

According to another aspect of the present disclosure, there is provided a transfer method of the above mentioned transfer device, the transfer method comprising:

by the at least one transfer assembly, transferring the target device to the prescribed position on the substrate carried by the first machine base.

The step of the at least one transfer assembly transferring the target device to the prescribed position on the substrate carried by the first machine base may comprise:

acquiring the target device from the second machine base by the transfer head;

moving the second machine base away from below the transfer head; and transferring the target device to the prescribed position on the substrate.

DETAILED DESCRIPTION

To improve understanding of the technical solution of the present disclosure for those skilled in the art, the transfer device and the transfer method thereof in the disclosure will be described below in detail in conjunction with the accompanying drawings and exemplary embodiments.

Figure 1:
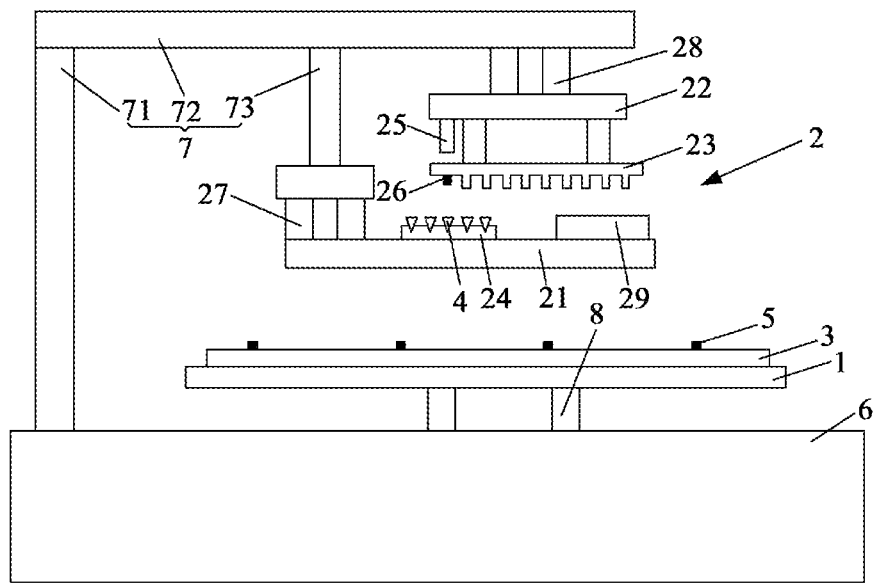
FIG. 1 is a schematic diagram illustrating a transfer device according to the first exemplary embodiment of the disclosure.

FIG. 1 is a schematic diagram illustrating a transfer device according to the first exemplary embodiment of the disclosure. As shown in FIG. 1, the transfer device comprises: a first machine base 1 and at least one transfer assembly 2 above the first machine base 1. The first machine base 1 is used for carrying a substrate 3, and the transfer assembly 2 is used for transferring a target device 4 to a prescribed position on the substrate 3.

The first machine base 1 carries the substrate 3 by a substrate chuck (not shown in FIG. 1). Specifically, the substrate chuck is provided on the first machine base 1 and the substrate 3 is located on the substrate chuck. In this exemplary embodiment, the substrate 3 is a large-size substrate, and the technical solution of this exemplary embodiment realizes transfer of large-size substrates.

In this exemplary embodiment, the target device 4 may be a wafer device.

The transfer assembly 2 comprises a second machine base 21, a third machine base 22 and a transfer head 23, wherein the second machine base 21, the third machine base 22, and the transfer head 23 are located above the first machine base 1, and the transfer head 23 is disposed on the third machine base 22. The second machine base 21 is used for carrying the target device 4. The transfer head 23 is used for acquiring the target device 4 from the second machine base 21 and transferring the target device 4 to a prescribed position on the substrate 3. In this exemplary embodiment, the transfer head 23 may acquire the target device 4 by means of electrostatic adsorption or polydimethylsiloxane (PDMS) adherence. The transfer head 23 may transfer the target device 4 to the prescribed position on the substrate 3, and then solidify the target device 4 by means of van der waals forces or resin heating so that the target device 4 is fixed on the prescribed position of the substrate 3. In this exemplary embodiment, the second machine base 21 is provided with a base plate 24 that is provided with the target device 4 so that the second machine base 21 carries the target device 4. The base plate 24 may be made of monocrystalline silicon or sapphire, and the target device 4 grows on the base plate 24.

The transfer assembly 2 further comprises an optical alignment means 25 and a first alignment mark 26. The optical alignment means 25 is disposed on the third machine base 22, and the first alignment mark 26 is disposed on the transfer head 23. The first alignment mark 26 is located opposite to and below the optical alignment means 25. The substrate 3 is provided with at least one second alignment mark 5. In this exemplary embodiment, the number of the second alignment mark 5 is four. Obviously, the number of the second alignment mark 5 is not limited thereto, but may be set to be any number according to the actual situation. The optical alignment means 25 is used for aligning the first alignment mark 26 and the second alignment mark 5 so that the target device 4 is aligned with the prescribed position on the substrate 3. In this exemplary embodiment, the optical alignment means 25 is located at an edge position of the third machine base 22, and the first alignment mark 26 is located at an edge position of the transfer head 23. In this exemplary embodiment, the optical alignment means 25 may be an optical alignment lens, and the alignment accuracy thereof may reach a micron order. In addition, the transfer head 23 may be made of a transparent material.

The transfer assembly 2 further comprises a third driving mechanism 28 that is connected with the third machine base 22 to drive the third machine base 22 to move toward the second machine base 21, thereby driving the transfer head 23 to acquire the target device 4 from the second machine base 21, and then to drive the third machine base 22 to move toward the substrate 3, thereby driving the transfer head 23 to transfer the target device 4 to the prescribed position on the substrate 3. The transfer assembly 2 further comprises a second driving mechanism 27 that is connected with the second machine base 21 so that the second machine base 21 is driven to move away from below the transfer head 23 after the transfer head 23 has acquired the target device 4. Both of the second driving mechanism 27 and the third driving mechanism 28 are able to move along X-axis, Y-axis and Z-axis directions of an XYZ three-dimensional coordinate system, and able to rotate a degree of θ during movement, wherein the X-axis direction is shown as a horizontal direction, the Y-axis direction is shown as a vertical direction, and the Z-axis is a direction perpendicular to the paper surface.

The second machine base 21 is provided with a cleaning device 29. After the transfer head 23 transfers the target device 4 to the prescribed position on the substrate 3, the second driving mechanism 27 drives the second machine base 21 to move to below the transfer head 23, and then the third driving mechanism 28 drives the third machine base 22 to move toward the second machine base 21 so that the transfer head 23 is driven to press toward the cleaning device 29 to realize cleaning of the transfer head 23. During the transfer process, the transfer head 23 may have particles adhered and/or produce residuals of the target device 4, and thus the transfer head 23 needs to be cleaned to remove the adhered particles and/or residuals of the target device 4. The cleaning device 29 is provided with an adhesive layer. When the transfer head 23 is pressed toward the cleaning device 29, particles and/or the target device 4 will be adhered to the adhesive layer of the cleaning device 29 so that cleaning of the transfer head 23 is completed. In this exemplary embodiment, the cleaning device 29 may be a cleaning sheet.

The transfer device further comprises: a device body 6 and a mechanical arm 7 disposed on the device body 6. The second driving mechanism 27 and the third driving mechanism 28 are both disposed on the mechanical arm 7. In this exemplary embodiment, the device body 6 may be disposed on a vibration isolation table with a vibration-proof level higher than VC8 so that vibration during operation of the transfer device is greatly reduced.

In this exemplary embodiment, as shown in FIG. 1, the mechanical arm 7 comprises a support member 71, a carrying member 72 and a connecting member 73. The support member 71 is disposed on the device body 6 at one end, and supports the carrying member 72 at the other end. The connecting member 73 is disposed on the carrying member 72 at one end, the second driving mechanism 27 is disposed at the other end of the connecting member 73 and the third driving mechanism 28 is disposed on the carrying member 72. Specifically, the third driving mechanism 28 is provided on the carrying member 72 at one end and connected with the third machine base 22 at the other end. As shown in FIG. 1, the support member 71 and the connecting member 73 are both disposed vertically, while the carrying member 72 is disposed horizontally.

In this exemplary embodiment, the number of the transfer assemblies 2 is one.

In this exemplary embodiment, the first machine base 1 is unmovable during transfer of the transfer device so that the substrate 3 is disposed on the first machine base 1 more stably, which ensures the accuracy during the transfer. However, in practical application, in consideration of production efficiency and designs of the transfer device, the first machine base 1 may be movable so as to facilitate movement to a predetermined position, thereby cooperating with the transfer head 23 to transfer. Therefore, the transfer device further comprises a first driving mechanism 8 that is disposed on the device body 6 and provided with the first machine base 1, and the first driving mechanism 8 is used for driving the first machine base 1 to move. Similar to the second driving mechanism 27 and the third driving mechanism 28, the first driving mechanism 8 is also able to move along X-axis, Y-axis and Z-axis directions of an XYZ three-dimensional coordinate system, and able to rotate a degree of θ during movement. For example, the first driving mechanism 8 may drive the first machine base 1 to move to a predetermined position in the Y-axis direction. In this exemplary embodiment, the first driving mechanism 8 may move accurately. Specifically, a moving accuracy of the first driving mechanism 8 may reach about 1 μm. During alignment, the first driving mechanism 8 and the third driving mechanism 28 cooperate with each other to realize accurate alignment of the target device 4 with the prescribed position on the substrate 3.

In this exemplary embodiment, the first driving mechanism 8, the second driving mechanism 27 and the third driving mechanism 28 are all servo motors. Obviously, the type of the first driving mechanism 8, the second driving mechanism 27 and the third driving mechanism 28 is not limited thereto, but any suitable type may be selected according to the actual situation as long as the first driving mechanism 8, the second driving mechanism 27 and the third driving mechanism 28 can drive the corresponding machine base to move.

The transfer process of the transfer device according to the exemplary embodiment will now be described in detail.

The third driving mechanism 28 drives the third machine base 22 to move toward the second machine base 21 from an initial position so that the transfer head 23 is driven to acquiring the target device 4 from the base plate 24 on the second machine base 21. The second driving mechanism 27 drives the second machine base 21 to move away from below the transfer head 23 so that the transfer head 23 is directly aligned with the substrate 3. The third driving mechanism 28 drives the third machine base 22 to move toward the substrate 3 so that the transfer head 23 is driven to move downward to approximate the substrate 3. Meanwhile, the third driving mechanism 28 indirectly drives the optical alignment means 25 to move via the third machine base 22 until the optical alignment means 25 aligns the first alignment mark 26 with the second alignment mark 5. The third driving mechanism 28 continues driving the third machine base 22 to move downward so that the transfer head 23 is driven to transfer the target device 4 to the prescribed position on the substrate 3. During this process, the transfer head 23 is pressed downward by being driven by the third driving mechanism 28 so that the target device 4 is pressed to be printed on the prescribed position of the substrate 3. Then the third driving mechanism 28 drives the third machine base 22 to move upward. At this time, the transfer head 23 is raised to return the initial position. The second driving mechanism 27 drives the second machine base 21 to move to below the transfer head 23. Before that, the base plate 24 on the second machine base 21 is replaced with a new one with a new target device 4. Similar, before that, the cleaning device 29 on the second machine base 21 may also be replaced with a new one, but the period for replacing the cleaning device 29 with a new one may be set as needed, e.g., replacing the cleaning device 29 with a new one may happen during each transfer process, or every ten times of transfer processes. The third driving mechanism 28 drives the third machine base 22 to move toward the second machine base 21 so that the transfer head 23 is driven to press toward the cleaning device 29 to realize cleaning of the transfer head 23. The third driving mechanism 28 drives the third machine base 22 to move upward so that the transfer head 23 is driven to move away from the cleaning device 29 and the third machine base 22 is driven to move toward the base plate 24 on the second machine base 21, thereby the step of driving the transfer head 23 to acquire the target device 4 from the base plate 24 for the next time is continued.

In the technical solution of the transfer device provided in this exemplary embodiment, the transfer assembly is located above the first machine base and transfers the target device to the prescribed position on the substrate carried by the first machine base. Since the transfer assembly is located above the first machine base, a path that the transfer head needs to move along to complete the transfer process is shorter, thereby improving the production efficiency.

Figure 2:
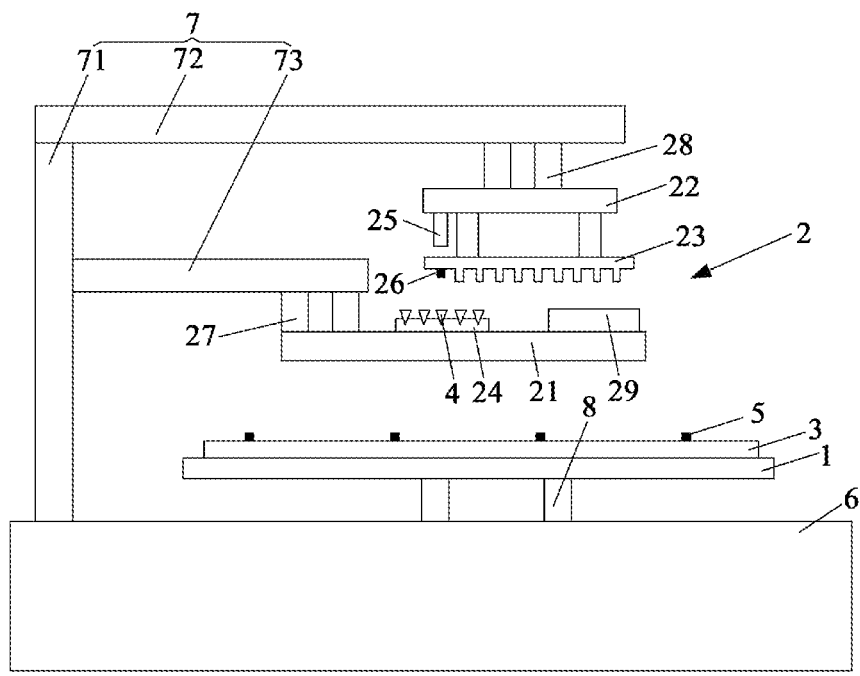
FIG. 2 is a schematic diagram illustrating a transfer device according to the second exemplary embodiment of the disclosure.

FIG. 2 is a schematic diagram illustrating a transfer device according to the second exemplary embodiment of the disclosure. As shown in FIG. 2, this exemplary embodiment differs from the first exemplary embodiment in that: in this exemplary embodiment, the connecting member 73 is disposed on the support member 71, instead of the carrying member 72, at one end.

As shown in FIG. 2, the support member 71 is disposed vertically, while the carrying member 72 and the connecting member 73 are both disposed horizontally.

Other configurations of this exemplary embodiment are the same with that of the first exemplary embodiment, so a detailed description thereof is not repeated here.

In the technical solution of the transfer device provided in this exemplary embodiment, the transfer assembly is located above the first machine base and transfers the target device to the prescribed position on the substrate carried by the first machine base. Since the transfer assembly is located above the first machine base, a path that the transfer head needs to move along to complete the transfer process is shorter, thereby improving the production efficiency.

Figure 3:
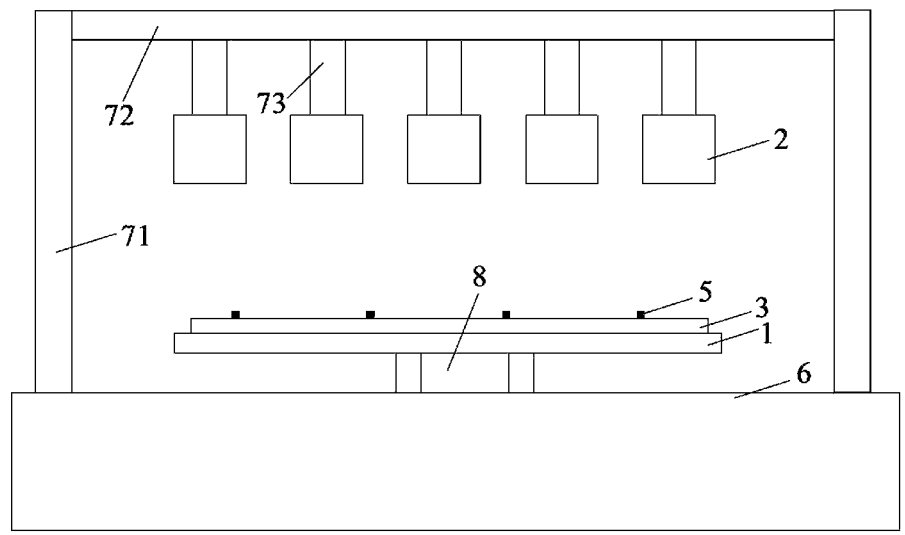
FIG. 3 is a schematic diagram illustrating a transfer device according to the third exemplary embodiment of the disclosure.

FIG. 3 is a schematic diagram illustrating a transfer device according to the third exemplary embodiment of the disclosure. As shown in FIG. 3, the transfer device comprises a first machine base 1 and at least one transfer assembly 2 above the first machine base 1. The first machine base 1 is used for carrying a substrate 3, and the transfer assembly 2 is used for transferring a target device 4 to a prescribed position on the substrate 3.

In this exemplary embodiment, the number of the transfer assemblies 2 is more than one, and a plurality of transfer assemblies 2 are arranged in parallel and transfer the target device 4 to the prescribed position on the substrate 3 synchronously.

In this exemplary embodiment, each of the transfer assemblies 2 may adopt the transfer assembly provided in the first exemplary embodiment, and a detailed description thereof is not repeated here.

In this exemplary embodiment, as shown in FIG. 3, the mechanical arm 7 comprises: two support members 71 disposed oppositely on the device body 6; a carrying member 72 that is supported by the two support members 71 respectively at two ends; and a connecting member 73 that is disposed on the carrying member 72 at one end. The settings of the second driving mechanism 27 and the third driving mechanism 28 are the same as that shown in FIG. 1. In other words, in this exemplary embodiment, except the number of the transfer assemblies 2 and the configuration of the mechanical arm 7, other configurations of this exemplary embodiment are the same with that of the first exemplary embodiment, so a detailed description thereof is not repeated here.

Figure 4:
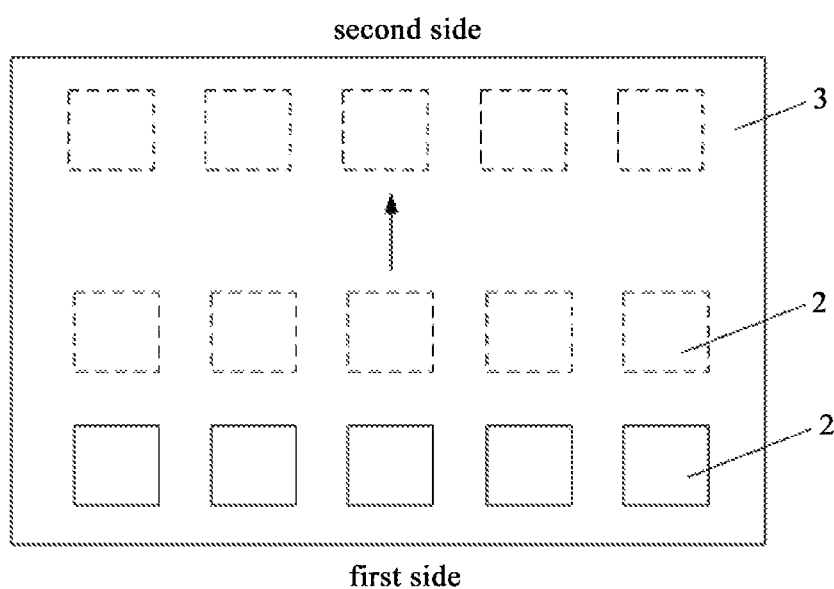
FIG. 4 is a schematic diagram illustrating a moving manner of the transfer device of FIG. 3.

FIG. 4 is a schematic diagram illustrating a moving manner of the transfer device of FIG. 3. As shown in FIG. 4, the transfer device starts transfer from a first side of the substrate 3 until the transfer on a second side of the substrate 3 is completed. Specifically, firstly, the plurality of transfer assemblies 2 arranged in parallel (shown in solid lines in FIG. 4) transfer the target device 4 to a prescribed position of a first row (a row nearest to the first side) on the substrate 3 synchronously. Then the plurality of transfer assemblies 2 arranged in parallel (shown in dash lines in FIG. 4) move toward the second side to a second row, and transfer the target device 4 to a prescribed position of the second row on the substrate 3 synchronously. The transfer process is repeated like this until the plurality of transfer assemblies 2 arranged in parallel transfer the target device 4 to a prescribed position of a last row (a row nearest to the second side) on the substrate 3 synchronously.

It can be seen from the above that, in this exemplary embodiment, a plurality of transfer assemblies transfer the target device to a prescribed position on the substrate in a parallel manner In the technical solution of the transfer device provided in this exemplary embodiment, a plurality of transfer assemblies arranged in parallel transfer the target device to a prescribed position on the substrate synchronously, thereby improving the production efficiency.

Figure 5:
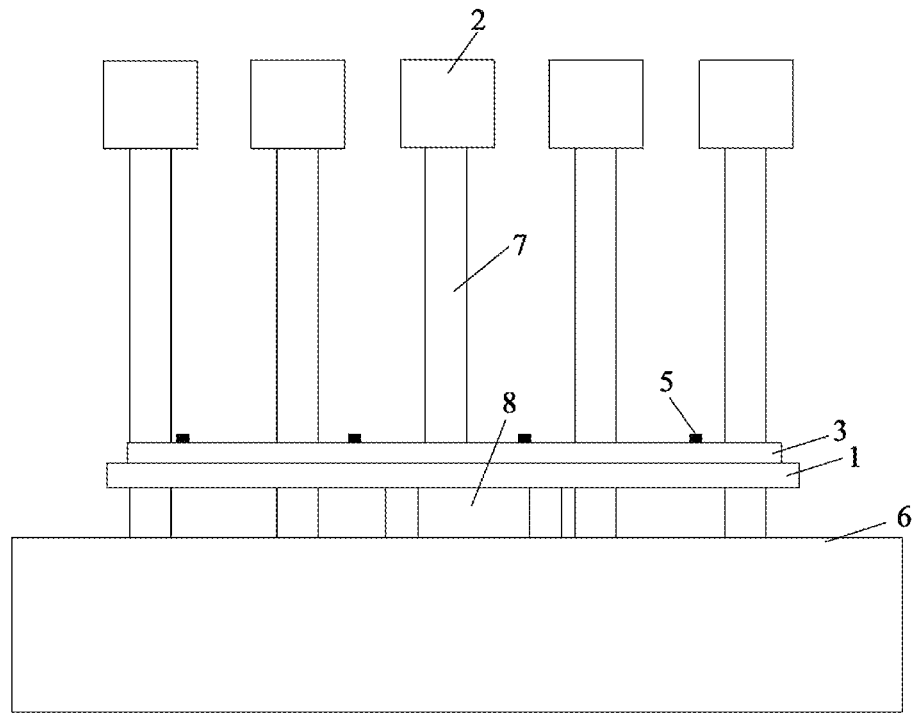
FIG. 5 is a schematic diagram illustrating a transfer device according to the fourth exemplary embodiment of the disclosure.

FIG. 5 is a schematic diagram illustrating a transfer device according to the fourth exemplary embodiment of the disclosure. As shown in FIG. 5, the transfer device comprises a first machine base 1 and at least one transfer assembly 2 above the first machine base 1. The first machine base 1 is used for carrying a substrate 3, and the transfer assembly 2 is used for transferring a target device 4 to a prescribed position on the substrate 3.

In this exemplary embodiment, the number of the transfer assemblies 2 is more than one, and each of transfer assemblies 2 transfers the target device 4 to the prescribed position on the substrate 3 independently. Specifically, each of transfer assemblies 2 may transfer the target device 4 to a prescribed position on the substrate 3 independently in a column where the transfer assembly 2 is located.

The transfer device further comprises a device body 6 and a plurality of mechanical arms 7 disposed on the device body 6. Each of the mechanical arms 7 is provided with a transfer assembly 2.

In this exemplary embodiment, each of the transfer assemblies 2 may adopt the transfer assembly provided in the first exemplary embodiment, and thus a detailed description thereof is not repeated here. In addition, a connecting manner between the transfer assembly 2 and the mechanical arm 7 may be changed as needed.

Other configurations of this exemplary embodiment are the same with that of the first exemplary embodiment, so a detailed description thereof is not repeated here.

Figure 6:
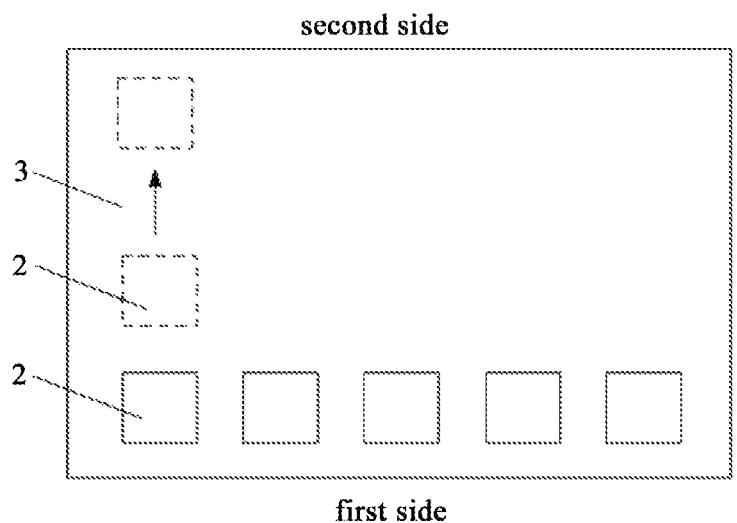
FIG. 6 is a schematic diagram illustrating a moving manner of the transfer device of FIG. 5.
Figures 7, 8:
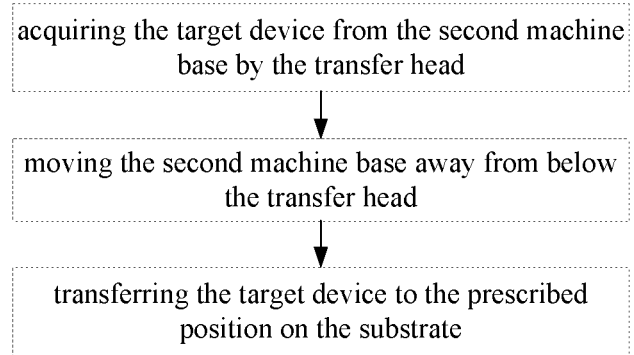
FIG. 7 is a block diagram showing a transfer method according to an embodiment of the present invention.
FIG. 8 is a block diagram showing the transfer method according to the embodiment shown in FIG. 7.

FIG. 6 is a schematic diagram illustrating a moving manner of the transfer device of FIG. 5. As shown in FIG. 6, since each of the transfer assemblies 2 may transfer independently, if a certain column needs to be transferred independently, the transfer may be completed by the transfer assembly 2 in the column, while transfer assemblies in other columns do not need to be operated. As shown in FIG. 6, if a first column at a left side of the substrate 3 needs to be transferred, the transfer assembly 2 of the first column (shown in solid line in FIG. 6) transfers the target device 4 to the prescribed position of the first row on the substrate 3. The transfer assembly 2 of the first column (shown in dash line in FIG. 6) moves toward the second side to a second row, and transfers the target device 4 to the prescribed position of the second row on the substrate 3. The transfer process is repeated like this until the transfer assembly 2 of the first column transfers the target device 4 to a prescribed position of a last row (a row nearest to the second side) on the substrate 3 independently. During this process, other transfer assembles 2 do not need to be operated. In practical application, the plurality of transfer assemblies 2 may also transfer the target device 4 to the prescribed position on the substrate 3 synchronously.

In the technical solution of the transfer device provided in this exemplary embodiment, each of the transfer assemblies may transfer the target device to the prescribed position on the substrate independently, thereby improving flexibility of the transfer process. Meanwhile, the plurality of transfer assemblies may also transfer the target device to the prescribed position on the substrate synchronously, thereby improving production efficiency.

The fifth exemplary embodiment of the disclosure provides a transfer method of the transfer device according to any one of the first to fourth exemplary embodiments. The transfer method comprises: by the transfer assembly, transferring a target device to a prescribed position on the substrate carried by the first machine base.

In this exemplary embodiment, the step of the transfer assembly transferring a target device to a prescribed position on the substrate carried by the first machine base comprises: acquiring the target device from the second machine base by the transfer head; moving the second machine base away from below the transfer head; and transferring the target device to the prescribed position on the substrate.

The transfer device of the disclosure is a micro transfer device and the transfer method is a micro transfer method.

In the technical solution of the transfer method of the transfer device provided in this exemplary embodiment, the transfer assembly is located above the first machine base and transfers the target device to the prescribed position on the substrate carried by the first machine base. Since the transfer assembly is located above the first machine base, a path that the transfer head needs to move along to complete the transfer process is shorter, thereby improving the production efficiency.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A transfer device with three machine bases, comprising:
  a first machine base that carries a substrate; and
  at least one transfer assembly that is located above the first machine base,
  wherein the at least one transfer assembly comprises:
  a second machine base that carries a target device;
  a third machine base that is located above the second machine base;
  a transfer head that is disposed on the third machine base for acquiring the target device from the second machine base and transferring the target device to a prescribed location on the substrate so that the target device is fixed on the prescribed location;
  an optical alignment device that is disposed on the third machine base; and
  a first alignment mark that is disposed on the transfer head and located opposite to and below the optical alignment device.

2. A transfer method of the transfer device according to claim 1, the transfer method comprising:
  by the at least one transfer assembly, transferring the target device to the prescribed position on the substrate carried by the first machine base.

3. The transfer method of the transfer device according to claim 2,
  wherein the step of the at least one transfer assembly transferring the target device to the prescribed position on the substrate carried by the first machine base comprises:
  acquiring the target device from the second machine base by the transfer head;
  moving the second machine base away from below the transfer head; and
  transferring the target device to the prescribed position on the substrate.

4. The transfer device according to claim 1, further comprising:
  a third driving mechanism that is connected with the third machine base to drive the third machine base to move toward the second machine base, thereby driving the transfer head to acquire the target device from the second machine base, and then to drive the third machine base to move toward the substrate, thereby driving the transfer head to transfer the target device to the prescribed position on the substrate.

5. The transfer device according to claim 4, further comprising:
  a second driving mechanism that is connected to the second machine base to drive the second machine base to move away from below the transfer head after the transfer head has acquired the target device.

6. The transfer device according to claim 5,
  wherein the second machine base is provided with a cleaning device, and
  wherein after the transfer head transfers the target device to the prescribed position on the substrate, the second driving mechanism drives the second machine base to move to below the transfer head, and then the third driving mechanism drives the third machine base to move toward the second machine base so as to drive the transfer head to press toward the cleaning device to realize cleaning of the transfer head.

7. The transfer device according to claim 5, further comprising:
  a device body; and
  a mechanical arm that is disposed on the device body,
  wherein the second driving mechanism and the third driving mechanism are both disposed on the mechanical arm.

8. The transfer device according to claim 7,
  wherein the mechanical arm comprises:
  a support member that is disposed on the device body at one end;
  a carrying member that is supported by the other end of the support member and provided with the third driving mechanism; and
  a connecting member that is disposed on the carrying member at one end and provided with the second driving mechanism on the other end.

9. The transfer device according to claim 7,
  wherein the mechanical arm comprises:
  a support member that is disposed on the device body at one end;
  a carrying member that is supported by the other end of the support member and provided with the third driving mechanism; and
  a connecting member that is disposed on the support member at one end and provided with the second driving mechanism on the other end.

10. The transfer device according to claim 7, further comprising:
  a first driving mechanism that is disposed on the device body, on which the first machine base is disposed so that the first driving mechanism can drive the first machine base to move.

11. The transfer device according to claim 1,
  wherein when the number of the at least one transfer assembly is two or more, each of the transfer assemblies transfers the target device to the prescribed position on the substrate independently.

12. The transfer device according to claim 11, further comprising:
a device body; and
a plurality of mechanical arms disposed on the device body, each of which is provided with a transfer assembly.

13. The transfer device according to claim 2,
wherein the substrate is provided with a second alignment mark that is aligned with the first alignment mark by the optical alignment device so that the target device is aligned with the prescribed position on the substrate.

14. The transfer device according to claim 1,
wherein when the number of the at least one transfer assembly is two or more, the at least one transfer assembly is arranged in parallel and transfers the target device to the prescribed position on the substrate synchronously.

\* \* \* \* \*